(12) United States Patent
Iseda et al.

(10) Patent No.: US 6,940,166 B2
(45) Date of Patent: Sep. 6, 2005

(54) SEMICONDUCTOR DEVICE AND METHOD FOR DESIGNING THE SAME

(75) Inventors: Yasunaga Iseda, Osaka (JP); Hideki Kanazawa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/761,310

(22) Filed: Jan. 22, 2004

(65) Prior Publication Data

US 2004/0159943 A1 Aug. 19, 2004

(30) Foreign Application Priority Data

Jan. 22, 2003 (JP) .................................... P. 2003-013923

(51) Int. Cl.⁷ ........................ H01L 23/48; H01L 23/52; H01L 29/40
(52) U.S. Cl. ...................................... 257/737; 257/775
(58) Field of Search ................................ 257/737, 775

(56) References Cited

U.S. PATENT DOCUMENTS 6,545,354 B1 * 4/2003 Aoki et al. .................. 257/734
6,812,565 B2 * 11/2004 Nishimoto et al. ......... 257/723
2002/0111009 A1    8/2002 Huang et al.

FOREIGN PATENT DOCUMENTS

JP          A-01-120040          5/1989

* cited by examiner

*Primary Examiner*—David Nelms
*Assistant Examiner*—Tu-Tu Ho
(74) *Attorney, Agent, or Firm*—McDermott Will & Emery LLP

(57) ABSTRACT

In a semiconductor device having an uppermost layer wiring beneath a bump to be connected to a rewiring layer wiring, the uppermost layer wiring is formed so that the surface of a protection film covered with the uppermost layer wiring has no unevenness beneath the bump.

6 Claims, 5 Drawing Sheets

SEMICONDUCTOR DEVICE AND METHOD FOR DESIGNING THE SAME

The present application is based on Japanese Patent Application No. 2003-013923, which is incorporated herein by reference.

BACKGROUND OF THE INVENTION

1. Field of the Invention

This invention relates to a semiconductor device and a method of manufacturing the same, and more particularly to a semiconductor device having an element wiring layer wiring beneath a bump connected to a rewiring layer wiring.

2. Description of the Related Art

A conventional structure beneath a bump has a metallic film having a larger area than its bonding area to the bump (For example, see Japanese Patent Publication No. Hei-1-120040).

Now referring to FIG. 5, an explanation will be given of an uppermost layer element wiring structure beneath a bump connected to a rewiring layer wiring of a conventional semiconductor device. FIG. 5 is a main-part enlarged view of an example of the uppermost layer element wiring structure beneath the bump connected to the rewiring layer wiring.

An uppermost layer wiring (also referred to as an element wiring) 102 above a semiconductor substrate 101 with a desired element region is covered with a protection film 103. An insulating film 104 is formed on the protection film 103. The insulating film 104 beneath a bump 105 is selectively removed. On the insulating film 104, a rewiring layer 106 is wired. Beneath the bump 105, a metallic film 107 is formed which connects the rewiring layer 106 and the bump 105.

In many cases, the uppermost layer wiring 102 has a narrower width than a connecting area between the bump 105 and the rewiring layer 106.

In this way, since there is the element wiring 102 having a narrower than the connecting area between the bump 105 and rewiring layer 106, a level difference or step will be formed at the portion corresponding to the edge of the element wiring 102 so that the protection film located at the step may be thin and fragile owing to the stress applied to the edge.

Further, an unevenness is formed on the surface of the protection film 103 and the rewiring layer 106 is formed on the uneven surface. In this case, the stress is concentrated on the edge of the unevenness so that the protection film 103 may be broken.

The bump having a large thickness is formed on the rewiring layer 106 so that greater stress is applied to the protection film. Further, since a high temperature occurs not only during the film deposition of the bump but also its using, i.e. connection of the semiconductor device to a printed board through the bump is made at a high temperature, the protection film is likely to deteriorate owing to further stress and heat.

Owing to the causes described above, the rewiring layer 106 and the element wiring 102 may be short-circuited owing to the step at the edge of the element wiring 102.

This invention has been accomplished under the above circumstance. An object of this invention is to provide a semiconductor device which can prevent an uppermost layer wiring and a rewiring from being short-circuited beneath a bump and is free from short-circuiting failure.

SUMMARY OF THE INVENTION

The semiconductor device according to this invention is a semiconductor device having an uppermost layer wiring beneath a bump to be connected to a rewiring layer wiring, wherein the uppermost layer wiring is formed so that the surface of a protection film covered with the uppermost layer wiring has no unevenness beneath the bump.

The semiconductor device according to this invention is a semiconductor device comprising an uppermost layer wiring formed on a semiconductor substrate, a rewiring layer formed so as to be connected to the uppermost layer wiring through a protection film, and a bump connected to the rewiring layer, wherein the semiconductor device has at least one uppermost layer element wiring structure located below the bump and having the uppermost layer wiring with a larger area than a connecting area between the bump and the rewiring layer.

In accordance with this configuration, since the surface of the protection film has no unevenness, stress is dispersed during the deposition of the rewiring layer so that the protection film will not be broken.

Specifically, since no level difference or step is formed at the portion corresponding to the edge of the uppermost layer wiring, the protection film located at the step is not thin and not fragile owing to the stress applied to the edge of the protection film.

Even when the bump having a large thickness is formed on the rewiring layer so that greater stress is applied to the protection film, not only during the film deposition of the bump but also its using, i.e. connection of the semiconductor device to a printed board through the bump is made, the protection film is not likely to deteriorate owing to further stress and heat.

Further, in the semiconductor device according to this invention, since the bump is formed within a region of a wiring width of the uppermost layer wiring, no unevenness exists beneath the bump. Therefore, the protection film has no thinned portion, thereby preventing short-circuiting failure.

The semiconductor device according to this invention is a semiconductor device comprising an uppermost layer wiring formed on a semiconductor substrate, a rewiring layer formed so as to be connected to the uppermost layer wiring through a protection film and a bump connected to the rewiring layer, wherein the bump is formed outside above the edge of the uppermost layer wiring connected to a different node from that of the rewiring layer connected to the bump.

In accordance with such a configuration, since the bump is formed outside the uneven region due to the edge of the uppermost layer wiring connected to a different node from that of the rewiring layer connected to the bump, the short-circuiting between the bump and the different node can be prevented.

Further, since the bump is formed outside above the edge of the uppermost layer wiring, no uneven portion in the uppermost layer wiring exists beneath the bump. Therefore, the protection film is not thinned, thereby surely preventing short-circuiting failure. Further, the bump can be also formed outside above the edge of the uppermost layer wiring connected to the same node as that of the rewiring layer connected to the bump.

Since the bump is formed within a region of a wiring width of the uppermost layer wiring, the wiring region is located beneath the bump but has no uneven portion. Therefore, the protection film is not thinned, thereby surely preventing short-circuiting failure.

The method of designing a semiconductor device according to this invention is a method of designing a semiconductor device comprising an uppermost layer wiring connected to an element region formed on a semiconductor substrate, a rewiring layer formed so as to be connected to the uppermost layer wiring through a protection film and a bump connected to the rewiring layer, wherein a process of arranging the bump comprises the steps of:

detecting whether or not an edge of the uppermost layer wiring exists within a region where the bump is to be arranged; and arranging the bump so that it is located outside above the edge of the uppermost layer wiring.

In such a method, the bump is not formed above the level difference so that stress and heat are not concentrated, thereby the film with high reliability.

In the method of designing a semiconductor device according to this invention, in the step of detecting, if it is decided that the edge of the uppermost layer wiring exists within the region where the bump is to be arranged, the bump is formed to be located outside above the edge of the uppermost layer wiring, by adjusting the size of the bump. Therefore, the size of the bump can be adjusted in the designing step so that the bump is located outside the level difference. If the resistance of the bump is problematic owing to the adjustment of the size, the problem can be solved by changing the material of the bump, for example.

In the method of designing a semiconductor device according to this invention, the size of the bump is made smaller than the wiring width of the uppermost layer wiring so that the bump is located within a region of the wiring width. This method surely prevents the bump from being formed above the step of the uppermost layer wiring.

The method of designing according to this invention is a method of designing a semiconductor device comprising an uppermost layer wiring formed on a semiconductor substrate, a rewiring layer formed through a protection film and a bump connected to the rewiring layer, wherein a process of arranging the bump comprises the step of:

arranging the bump so that it is located outside above the edge of the uppermost layer wiring connected to a different node from that of the rewiring layer connected to the bump.

Such a method can arrange the bump in a designing step so that the step due to the edge of the uppermost layer wiring is not located beneath the bump.

In the method of designing a semiconductor device according to this invention, the process of arranging the bump comprises the step of:

arranging the bump so that it is located outside above the edge of the uppermost layer wiring. In this case, the bump is located outside not only the edge of the uppermost layer wiring connected to a different node but also all the edges of the uppermost layer wiring so that the bump can be more surely arranged above the protection film covered with the uppermost layer wiring.

In the method of designing a semiconductor device according to this invention, the process of arranging the bump comprises the step of:

arranging the bump so that it is located within a region of a wiring width of the uppermost layer wiring. Therefore, the bump can be more surely arranged above the protection film covered with the uppermost layer wiring.

In the method of designing a semiconductor device according to this invention, the process of arranging the bump comprises the step of:

arranging the bump so that it is located outside a region where the uppermost layer wiring exists. This method can surely prevent short-circuiting failure.

The method of designing a semiconductor device according to this invention comprises the step of arranging each uppermost layer element wiring structure described above is located beneath all the bumps. This method surely provides a semiconductor device with no short-circuiting failure.

DETAILED DESCRIPTION OF THE PREFERRED EMBODIMENTS

Embodiment 1

Figure 1:
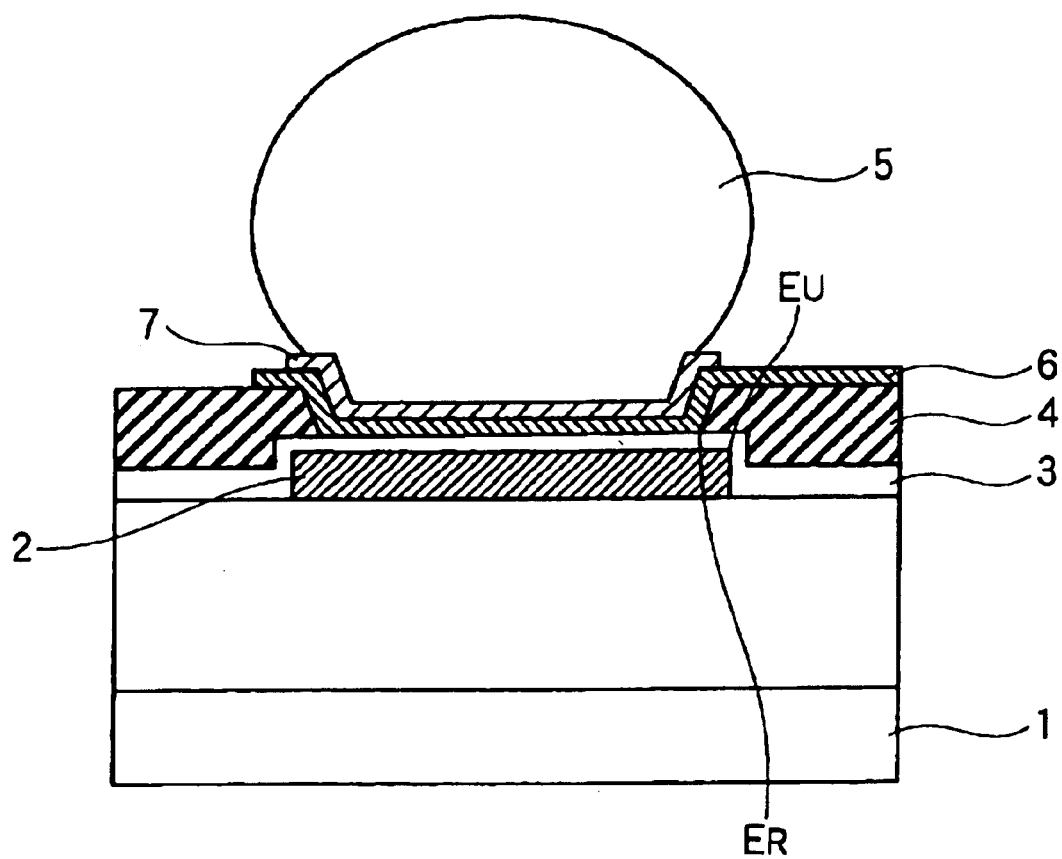
FIG. 1 is a sectional view showing a structure of a bump and an uppermost layer wiring beneath it in a semiconductor device according to the first embodiment of this invention.

Referring to FIG. 1, an explanation will be given of a bump and a wiring structure beneath it of the semiconductor device according to the first embodiment of this invention.

An uppermost layer wiring 2 made of an aluminum thin film is formed on a semiconductor substrate 1 with a desired semiconductor element such as a MOSFET formed therein. The uppermost layer wiring 2 is covered with a protection film 3 of a silicon nitride film. On the protection film 3, an insulating film 4 of a silicon oxide film is formed. The insulating film 4 is selectively removed. On the insulating film 4, a rewiring layer 6 of a copper thin film is formed. On the rewiring layer 6, a metallic film 7 of an Au thin film is formed. On the metallic film 7, a bump 5 is formed. The rewiring layer 6 is connected to the bump 5 through the metallic film 7. The uppermost layer wiring 2 has a wider width and larger area than those of the connecting region between the bump 5 and rewiring layer 6.

As described above, in accordance with the semiconductor device according to the first embodiment of this invention, the edge EU of the outermost layer wiring 2 is located outside beneath the bump 6, even if the protection film 3 overlying the uppermost layer wiring 2 is thin, no rewiring and bump is located at a region opposite to the edge so that short-circuiting does not occur. At the edge ER contiguous to the underlying rewiring layer 2 connected to the bump 6, the uppermost layer wiring 2 is flat so that the surface of the overlying protection film 3 can be made flat. Thus, stress is dispersed during the deposition of the rewiring layer 6, thereby preventing the protection film 3 from being broken and the rewiring layer 6 and the uppermost layer wiring 2 from being short-circuited.

Embodiment 2

An explanation will be given of the semiconductor device according to the second embodiment of this invention. In the semiconductor device according to this embodiment, the uppermost layer wiring 2 beneath the entire bump 5 in the first embodiment described above is arranged each of all bumps.

In accordance with the configuration of the semiconductor device according to this embodiment, the wring width of the uppermost layer wiring 2 can be easily made larger than the underlying wirings. Therefore, as long as the position of the bump 5 is determined, the layout of the uppermost layer wiring 2 can be realized effectively, thereby preventing an increase in the chip area.

Embodiment 3

Figure 2:
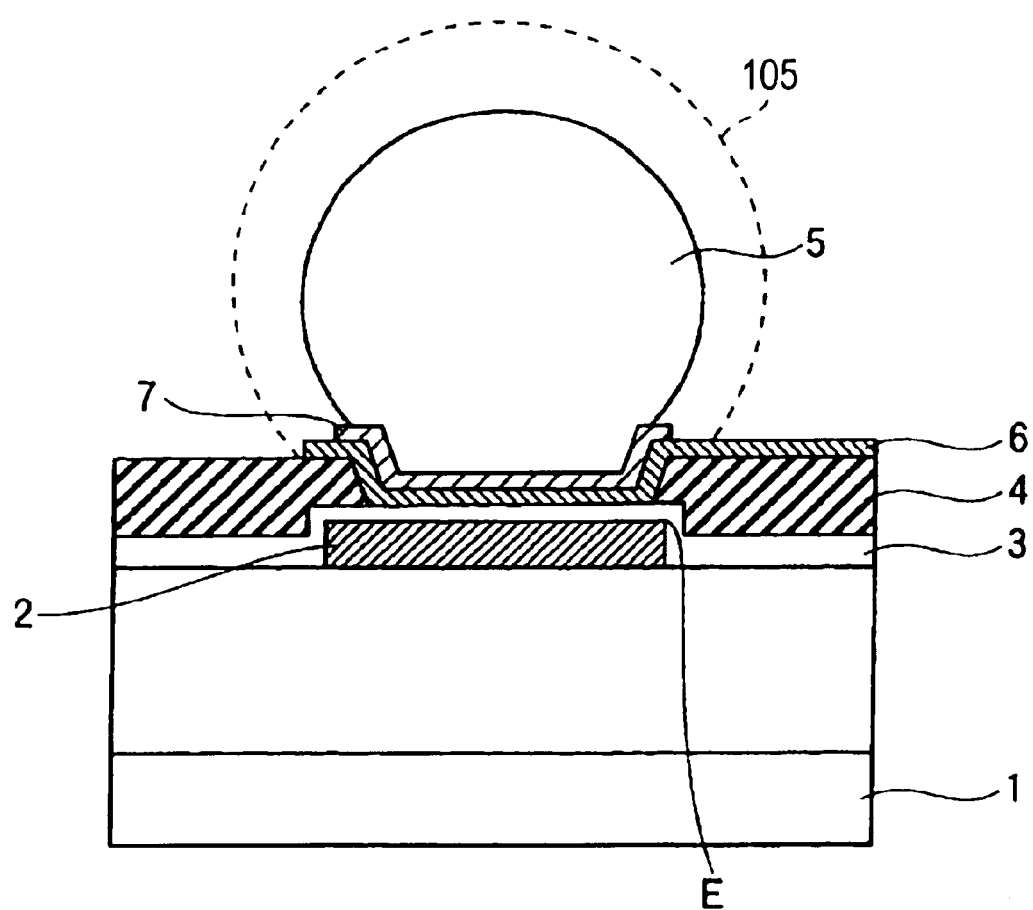
FIG. 2 is a sectional view showing a structure of a bump and an uppermost layer wiring beneath it in a semiconductor device according to the third embodiment of this invention.
Figure 3:
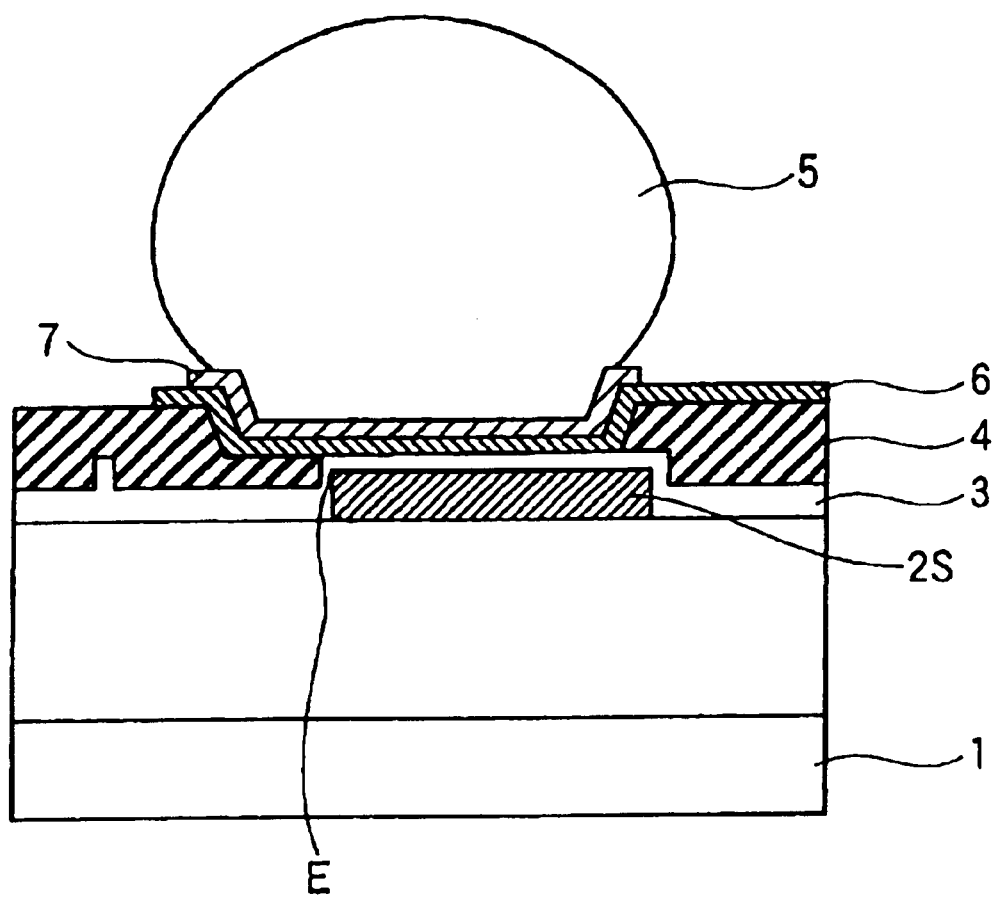
FIG. 3 is a sectional view showing a structure of a bump and an uppermost layer wiring beneath it in a semiconductor device according to the fourth embodiment of this invention.

An explanation will be given of the semiconductor device according to the third embodiment of this invention. In the configuration of the semiconductor device according to this embodiment, if the width of the uppermost layer wiring 2 is narrow, the bump is made smaller than the inherent bump 105 indicated by dotted line so that the edge of the uppermost layer wiring 2 is located outside beneath the bump 5 as shown in FIG. 2.

As described above, in accordance with the semiconductor device in this embodiment, even if the uppermost layer 2 is limited, the limitation can be adjusted by the size of the bump. Further, in such a case, by changing the material of the bump into e.g. gold with low resistance, the layout of the uppermost layer wiring 2 can be realized with no change in the property of the semiconductor device.

Embodiment 4

An explanation will be given of the semiconductor device according to the fourth embodiment of this invention.

In the semiconductor device according to this embodiment, the edge of an uppermost layer wiring 2S is opposite to the bump. In this case, by locating the bump in the same node as that of the uppermost layer wiring 2S, even if the protection film is thin, a potential difference does not occur between the opposite portions so that concentration of the electric field does not also occur.

As described above, in accordance with the semiconductor device in this embodiment, even if the uppermost layer 2 is limited, short-circuiting failure can be prevented by adjusting the location of the bump.

In such a case, by changing the material of the bump into e.g. gold with low resistance, the layout of the uppermost layer wiring 2 can be realized with no change in the property of the semiconductor device.

Embodiment 5

An explanation will be given of the semiconductor device according to the fifth embodiment of this invention.

Figure 4:
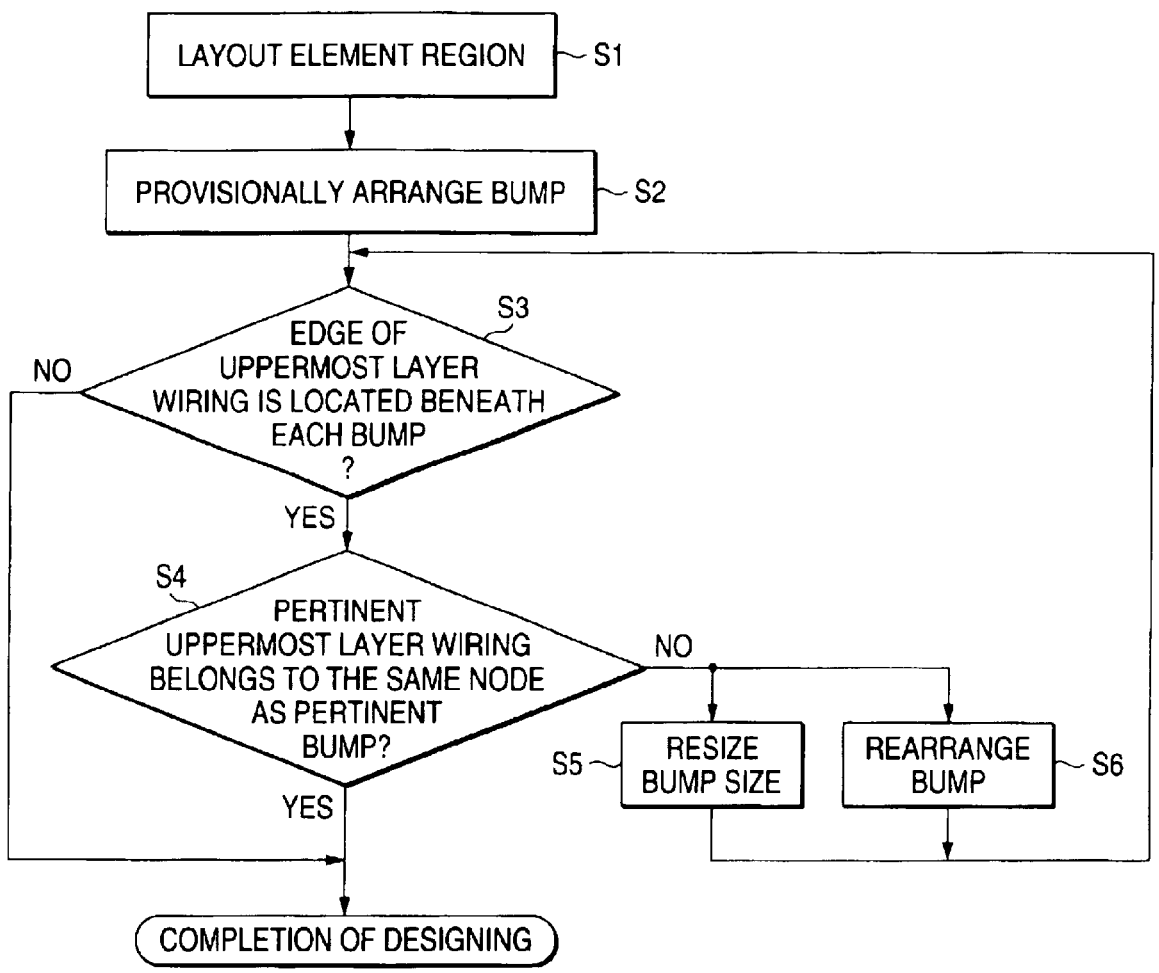
FIG. 4 is a flowchart showing the process of designing a semiconductor device according to the fifth embodiment of this invention.

This embodiment is characterized, in a layout process as shown in the flowchart of FIG. 4, by comprising the steps of detecting whether or not the uppermost layer wiring has an edge in a region where the bump is to be located in locating the bump, and of locating the bump outside above the edge of the uppermost layer wiring.

Specifically, upon completion of the layout of an element region (step S1), the bump is arranged provisionally (step S2).

It is detected and decided whether or not the edge of the uppermost layer wiring exists in the region where the bump is to be arranged (step S3).

In this decision step, if the edge of the uppermost layer wiring does not exist beneath the bump, designing is completed.

On the other hand, in step S3, when it has been decided that the edge of the uppermost layer wiring exists beneath the bump, it is decided whether or not the uppermost layer wiring belongs to the same node as that of the bump (step S4).

If it is decided that the uppermost layer wiring belongs to the same node as that of the bump, designing is completed.

If it is decided that the uppermost layer wiring does not belongs to the same node as that of the bump, the size of the bump is resized (step S5).

Otherwise, the bump is rearranged (step S6) and the designing process returns to the decision step S3.

In accordance with such a configuration, by the adjustment in the designing process, the bump can be formed so that it is not located on the level difference. Therefore, with no concentration in the stress and heat, the uppermost layer wiring can be formed with high reliability.

Figure 5:
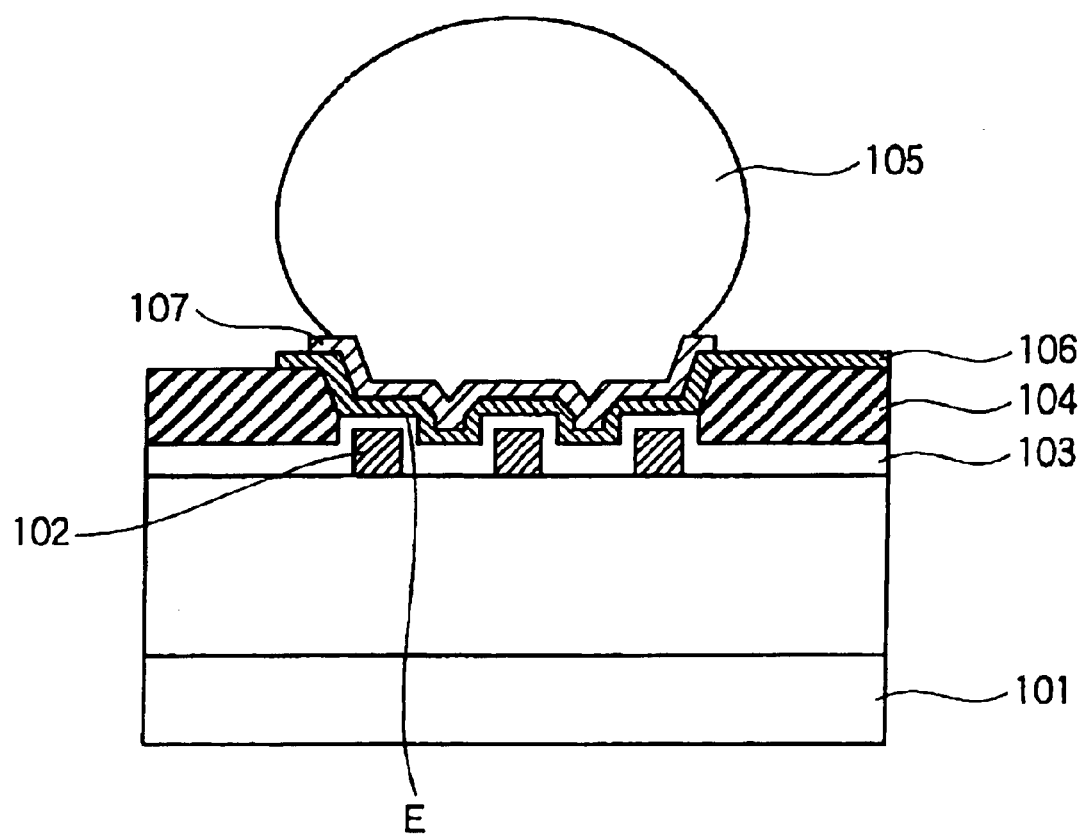
FIG. 5 is a sectional view of a structure of a bump and the wirings beneath it in a conventional semiconductor device.

Incidentally, also in the structure as shown in FIG. 5, if the uppermost layer wiring 102 belongs to the same node as that of the bump 105, concentration of the electric field may not occur and hence short-circuiting failure may not also occur.

In the semiconductor device comprising an uppermost layer wiring beneath a bump connected to a rewiring layer wiring, the uppermost layer wiring is formed so as to have a larger area than a connecting area between the bump and the rewiring layer wiring. For this reason, the surface of the protection film on the uppermost layer wiring can be made flat beneath the bump.

Thus, stress is dispersed during the deposition of the rewiring layer, thereby preventing the protection film from being broken and the rewiring layer wiring and the element wiring layer wiring from being short-circuited.

The wring width of the uppermost layer wiring can be easily made larger than the underlying wirings. Therefore, as long as the position of the bump is determined, the layout of the uppermost layer wiring can be made effectively, thereby preventing an increase in the chip area.

If the arrangement of the bump is designed so that it does not exist above the edge of the uppermost layer wiring, it can be easily adjusted in the layout step.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed

What is claimed is:

1. A semiconductor device comprising:
   an uppermost layer wiring formed on a semiconductor substrate;
   a rewiring layer formed on said uppermost layer wiring through a protection film; and
   a bump electrically connected to said rewiring layer, and formed within a region of said uppermost layer wiring.
   wherein said bump is formed within a region of a wiring width of said uppermost layer wiring.

2. A semiconductor device comprising:
   an uppermost layer wiring formed on a semiconductor substrate;
   a rewiring layer formed on said uppermost layer wiring through a protection film; and
   a bump electrically connected to said rewiring layer, and formed within a region of said uppermost layer wiring.
   wherein said bump is formed inside of the sides of the uppermost layer wiring and formed within a region of a wiring width of said uppermost layer wiring.

3. A method of designing a semiconductor device comprising:
   an uppermost layer wiring formed on a semiconductor substrate,
   a rewiring layer formed through a protection film and a bump connected to said rewiring layer,
   wherein a process of arranging said bump comprises a step of:
   arranging said bump so that it is located inside of the sides of said uppermost layer wiring, and arranging said bump so that it is located within a region of a wiring width of said uppermost layer wiring.

4. A method of designing a semiconductor device comprising a step of arranging the uppermost layer element wiring structure described in claim 1 such that the uppermost layer element wiring structure is located beneath each of all bumps.

5. A method of designing a semiconductor device comprising a step of arranging the uppermost layer element wiring structure described in claim 2 such that the uppermost layer element wiring structure is located beneath each of all bumps.

6. The semiconductor device according to claim 1, wherein all of the bumps in the semiconductor device are formed within a region of said uppermost layer wiring.

* * * * *